United States Patent [19]
Artieri et al.

[11] Patent Number: 5,111,066
[45] Date of Patent: May 5, 1992

[54] CLOCK FREQUENCY DOUBLER

[75] Inventors: Alain Artieri, Meylan; Sylvain Kritter, Grenoble, both of France

[73] Assignee: SGS-Thompson Microelectronics S.A., Gentilly Cedex, France

[21] Appl. No.: 653,633

[22] Filed: Feb. 12, 1991

[30] Foreign Application Priority Data

Feb. 13, 1990 [FR] France .................. 90 02216

[51] Int. Cl.⁵ ............................................. H03K 3/00
[52] U.S. Cl. ...................................... 307/271; 328/20
[58] Field of Search ...................... 307/260, 269, 271; 328/15, 20

[56] References Cited

U.S. PATENT DOCUMENTS 4,634,987  1/1987  Nolte ................... 328/20 X

FOREIGN PATENT DOCUMENTS 2379198  8/1978  France .
0098556  8/1979  Japan ................... 328/20

OTHER PUBLICATIONS

Fisher, "Frequency Doubler from Clock-Pulse Reconstructer", Electronic Engineering, Aug. 1975, p. 7.
IBM Technical Disclosure Bulletin, vol. 29, No. 1, Jun. 1986.
Electrical Design News Article by Giboney, entitled "Double-Edge Pulser Uses Few Parts", vol. 17, 1972.

Primary Examiner—Robert J. Pascal
Attorney, Agent, or Firm—Lowe, Price, LeBlanc & Becker

[57] ABSTRACT

A circuit for generating non-overlapping complementary clock signals at a double frequency from an input clock signal. An NAND flip-flop (2) has complementary outputs on which double frequency signals are available. A D-type flip-flop (3) receives on its clock input (H) one of the outputs of the NAND flip-flop, and has its output ($Q_D$) coupled to its data input (D) through an inverter. Two Exclusive OR gates (XO1, XO2) receive on their first inputs the input clock signal and its complement, respectively, and on their second input the output of the D-type flip-flop. The outputs of the OR gates are connected to the inputs (E1 and E2) of the NAND flip-flop, respectively.

8 Claims, 4 Drawing Sheets

CLOCK FREQUENCY DOUBLER

BACKGROUND OF THE INVENTION

The present invention relates to the generation of complementary clock signals with non-overlapping phases at twice the frequency of an input clock signal.

Before describing the invention, the operation of a clock generator with non-overlapping phases comprising NAND gates, further called NAND flip-flop will be reminded. It will be noted that this flip flop is different of a conventional RS flip-flop made with NOR gates.

FIG. 1A schematically shows an NAND flip-flop 1 comprising two input terminals E1 and E2 and two complementary outputs Q* and Q. This flip flop includes two NAND gates A1 and A2. The first input of gate A1 is connected to terminal E1 and the second input to output Q of gate A2. The first input of gate A2 is connected to terminal E2 and the second input to the complementary output Q* of gate A1. Inputs E1 and E2 respectively receive a clock signal CLK and the complementary signal CLK*

FIG. 1B shows the shape of the signals at the inputs and outputs. Considering a state where the input clock CLK is low, CLK* is high, Q* is high and Q is low. When CLK* goes low, the NAND gate A2 changes its state and signal Q goes high after a delay depending upon the structure of gate A1. This switching of the output Q causes switching of gate A1 and signal Q* goes low after a second delay.

It will be noted, as known in the art, that the delay caused by a high/low switching such as the one of output Q* may be different of the delay associated with a high/low switching such as the one of output Q.

Then, when the signal CLK goes high, the transition to low level of signal CLK causes the switching of gate A1 and the transition to high level of output Q* after the first delay, while gate A2 then switches after the second delay to allow output Q to go low. Then, signals Q and Q* having the same period as the input clock signals CLK and CLK* are obtained, but the phases during which these signals Q and Q are at low level are not overlapping. It is said that clock signals with non-overlapping low phases have been generated.

An object of the invention is to provide a circuit particularly simple and fully integrable for providing, from an input clock signal, complementary non overlapping clock signals with double frequency.

A further object of the invention is to provide a simple and integrable circuit for providing, from an input clock signal, on the one hand, non overlapping clock signals of equal frequency and, on the other hand, non overlapping clock signals of double frequency, a determined phase relationship being established between the single frequency and double frequency signals.

SUMMARY OF THE INVENTION

To attain these objects, the invention provides a circuit for generating non overlapping complementary clock signals of double frequency from an input clock signal, comprising an NAND flip-flop with NAND gates and complementary outputs on which double frequency signals are available; a D type flip flop receiving on its clock input one of the outputs of the NAND flip flop, the output of the D-type flip flop being coupled to its data input through an inverter; and two Exclusive OR gates receiving on their first inputs the input clock signal and its complement, respectively, and, on their second input, the output of the D-type flip-flop, the outputs of the Exclusive OR gates being connected to the inputs of the NAND flip flop.

BRIEF DESCRIPTION OF THE DRAWINGS

The foregoing and other objects, features and advantages of the invention will be apparent from the following detailed description of preferred embodiments as illustrated in the accompanying figures wherein.

In most of the accompanying figures, signals are represented as being perfectly rectangular. In fact, those skilled in the art will note that each of these signals has a slight slope during high to low transitions, and conversely.

DETAILED DESCRIPTION OF THE INVENTION

Figure 1A:
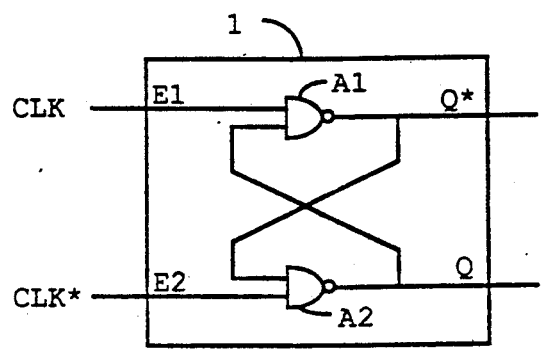
FIG. 1A, above described, shows an NAND flip-flop for generating non-overlapping complementary clock signals.
Figure 2A:
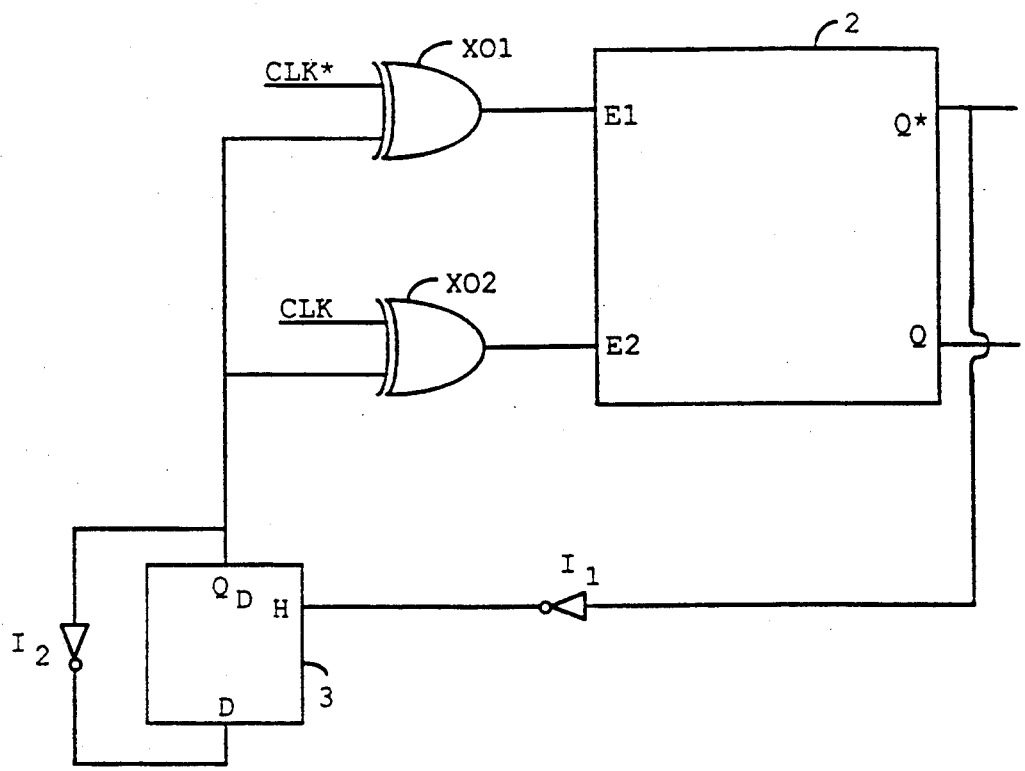
FIG. 2A shows a clock frequency doubling circuit with non-overlapping phases according to the invention.

FIG. 2A shows a frequency doubler according to the invention. This frequency doubler comprises an NAND flip-flop 2 and a D-type flip-flop 3. Flip-flop 2 is formed in the way shown in FIG. 1A. The output Q* of flip flop 2 is connected to the clock input H of the D-type flip flop 3 through an inverter I1. The QD data output of flip flop 3 is connected to its D data input through an inverter I2. The $Q_D$ output is also connected to the second inputs of Exclusive OR gates X01 and X02, the first inputs of which respectively receive the input clock signals CLK* and CLK. The output of gate X01 is connected to the input E1 of flip flop 2 and the output of gate X02 is connected to the input E2 of this flip flop.

Figure 1B:
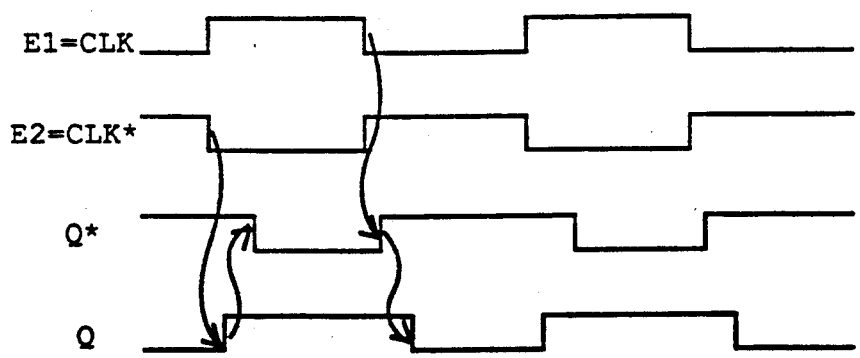
FIG. 1B shows signals appearing at the inputs and outputs of the circuit of FIG. 1A.
Figure 2B:
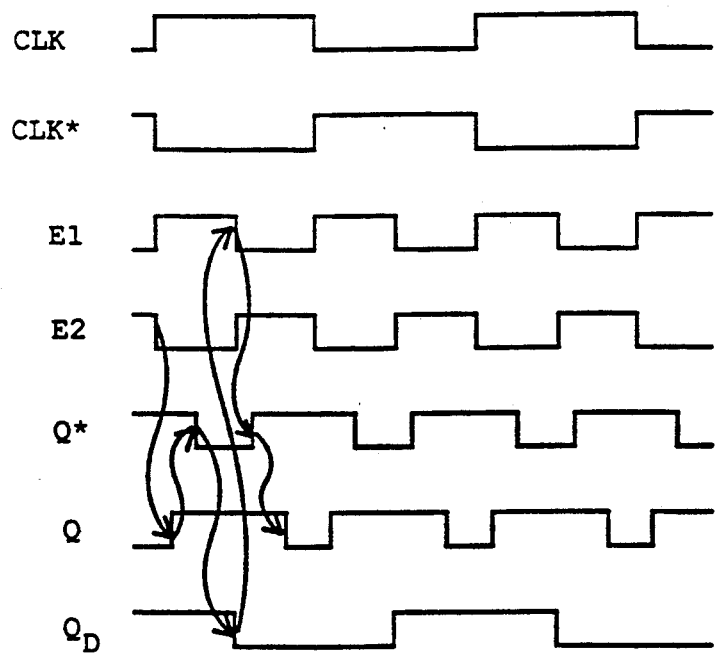
FIG. 2B shows signals appearing at various points of the circuit of FIG. 2A.

The operation of this circuit will be explained in relation with FIG. 2B. In an initial state, signal CLK is at low level, signal CLK* at high level, input E1 at low level, input E2 at high level, output Q* at high level, output Q at low level and output $Q_D$ at high level. As in the case of FIG. 1B, the transition to low level of input E2 causes, after a first delay, the transition to high level of output Q then, after a second delay, the transition to low level of output Q*. This transition to low level of the Q* output causes the D type flip flop to provide at its output $Q_D$ the state corresponding to the signal at its D input, that is, after a third delay which depends upon the transfer time of the D flip-flop, the output $Q_D$ goes from high to low level. Assuming that the Exclusive OR gates X01 and X02 do not introduce any delay, this causes switching of inputs E1 and E2. Then, in the same way as described in relation with FIG. 1B, the transition to low level to input E1 causes, after the first delay, transition to high level of the Q* output then a transition to low level of the Q output. The next switching is associated to the change in state of signals CLK and CLK*.

Clock signals Q* and Q with non-overlapping low phases, at a double frequency with respect to the clock frequency CLK, have therefore been provided.

Intermediate transitions of signals E1 and E2 have been shown at the middle of the clock intervals. This is not actually the case since, as indicated, these intermediate transitions result from the sum of 3 delays.

An advantage of the invention is that the various flip-flops used are manufactured according to the same technology on a single integrated circuit. A self-regulation of the system will therefore occur when external conditions (temperature, etc.) or manufacturing conditions vary. More particularly, the time of transition to low level of signal Q*, which essentially depends on the transfer time of the D flip-flop, will necessarily be sufficient for controlling other circuits of the same type.

Another method for describing the above circuit consists in noting that the signal $Q_D$ is a signal having a phase delay with respect to signal CLK. In the prior art, it is known how to obtain double frequency signals by combining a clock signal with this same phase-shifted clock signal. However, the prior art circuits involve the use of delay circuits which are complex to manufacture and which usually require components external to an integrated circuit, such as high-value capacitances. The method according to the invention provides the same result with a particularly simple circuit, occupying a small surface on an integrated circuit, for which no external component is required and which is self-regulated with respect to variations in technology and environment.

Figure 3A:
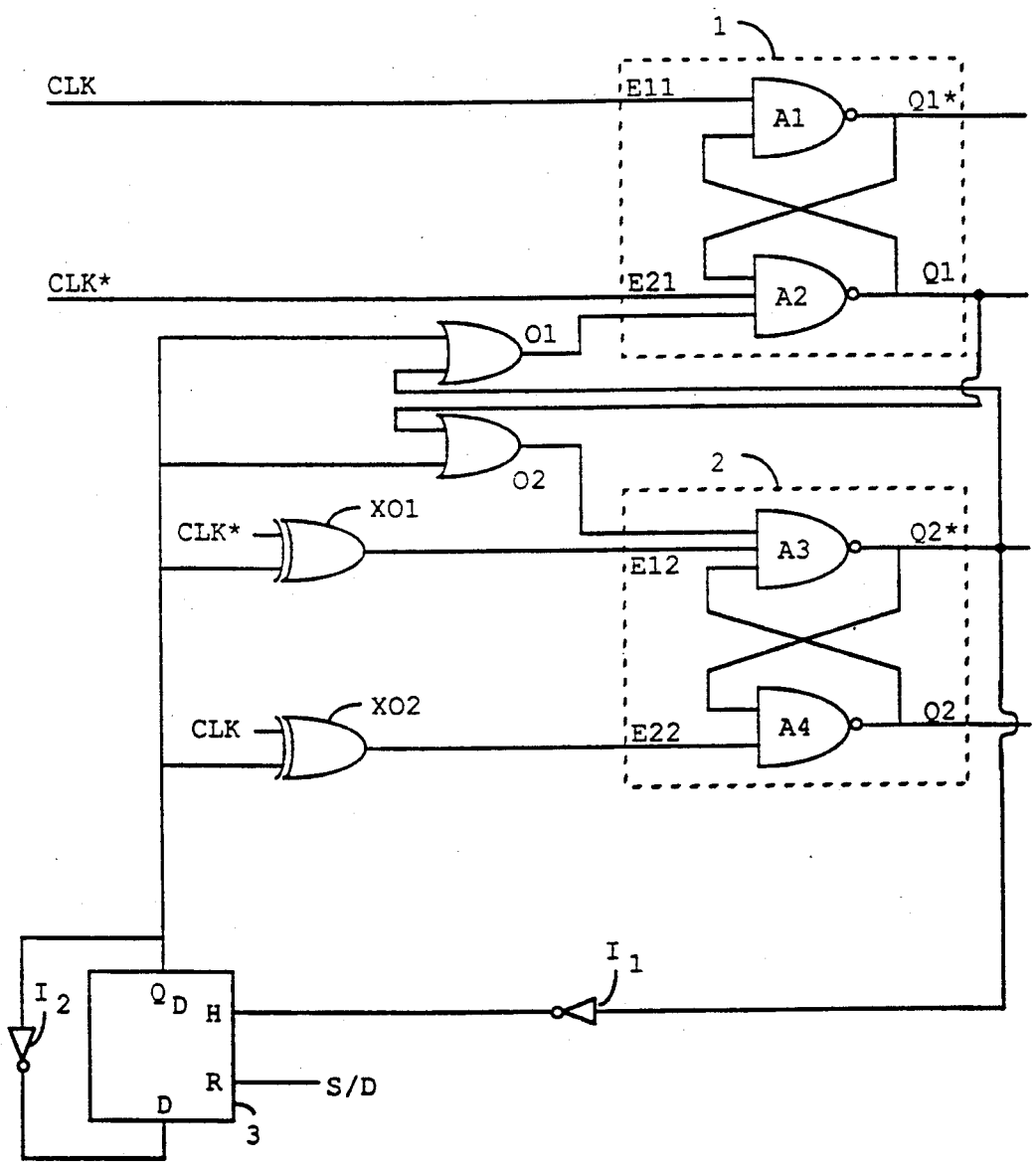
FIG. 3A shows a circuit providing non-overlapping clock signals at single and double frequency, a synchronization being ensured between the single and double frequency signals.

FIG. 3A shows another aspect of the invention obtaining non overlapping signals at a first frequency and at a double frequency, the double frequency signals having a determined phase-shift with respect to the single frequency signals, for example for one of their rising edges or one of their falling edges.

For example, in an application to a data processing system, it is sometime desired to convert words with a determined definition, for example 8-bit words, into words with a double definition, for example 16 bit words, to perform rapid and accurate calculations, then to retain the 8 most significant bits of the 16 bit word. It is then necessary to write in registers shifted at a double frequency from registers shifted at a single frequency. For this purpose, the rising edge of the first double frequency pulse must arrive before the falling edge of the second simple frequency pulse. Conversely, in order to obtain a satisfactory writing in a simple frequency register by the content of a double frequency register, the rising edge of the first single frequency pulse must arrive before the falling edge of the second double frequency pulse.

To attain such a result, it is possible to associate a non-overlapping complementary clock pulse generator at a simple frequency such as the one of FIG. 1A with a generator at a double frequency non overlapping complementary clock pulse such as the one of FIG. 2A in the way shown in FIG. 3A, by adding an additional enabling condition on one of the NAND gates of each of the NAND flip flops 1 and 2. This additional condition is imposed as illustrated in the figure by OR gates O1 and O2, each input of which receives the output $Q_D$ of flip flop 3. The output of each OR gate is applied to the input of the NAND gate, whose output has to be phase-controlled, and each OR gate receives on its second input the output of the NAND gate of the other flip-flop of which phase-control is desired.

Figure 3B:
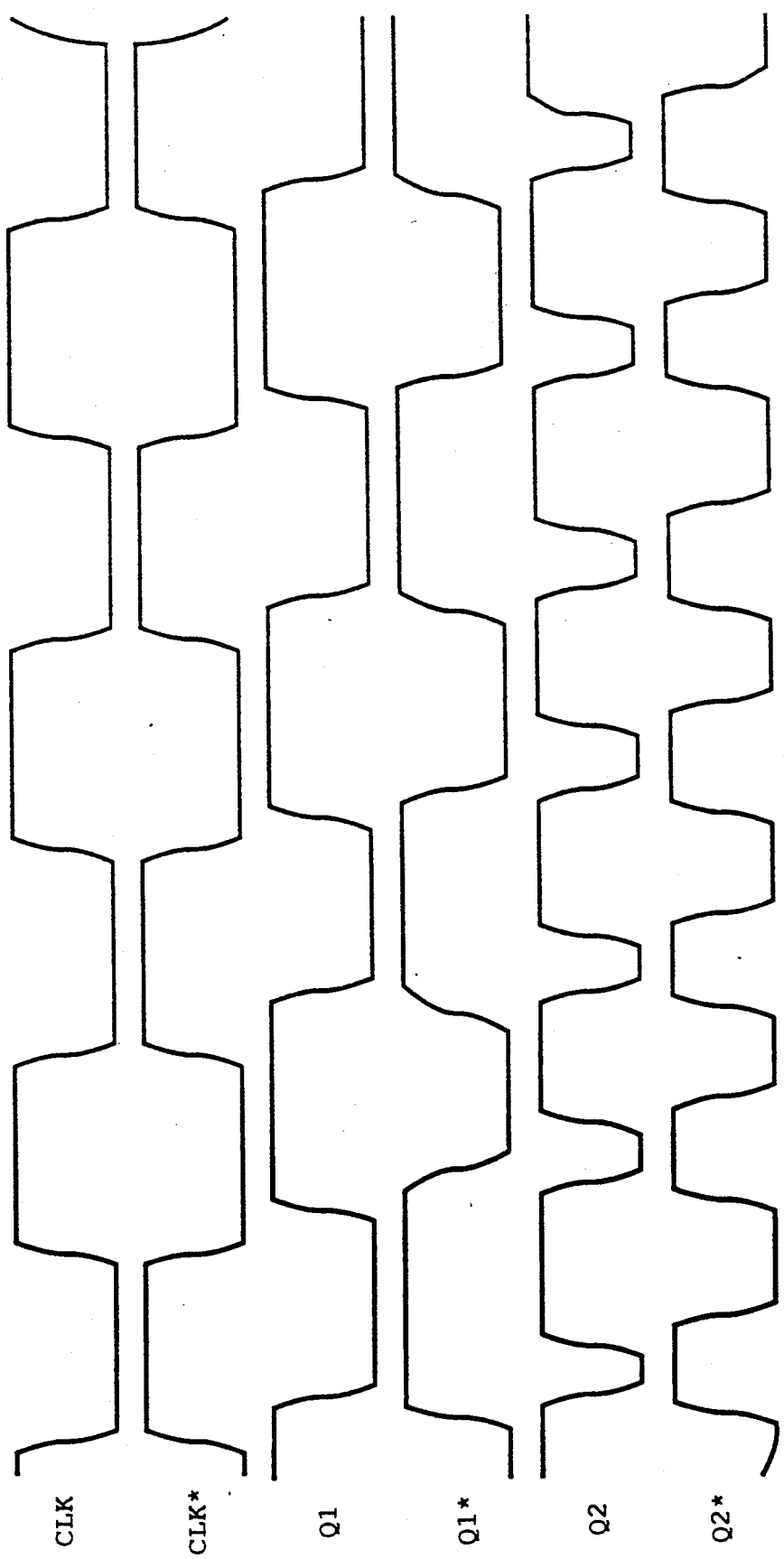
FIG. 3B shows signals appearing at various points of the circuit of FIG. 3A.

FIG. 3B shows the shape of the signals obtained with the circuit of FIG. 3A. Q1 and Q1* designate the outputs of flip-flop 1, and Q2 and Q2 designate the outputs of flip-flop 2. It will be noted that these outputs are non-overlapping at low level and the desired mutual phase relations are obtained.

It will also be noted in FIG. 3A that the D-type flip-flop 3 comprises a reset input R on which a S/D (single/double frequency) signal is applied. If this S/D signal does not enable the reset input of flip-flop 3, the operation is such as previously described. If this S/D signal constantly applies a reset signal to flip-flop 3, the state of the output $Q_D$ does not vary and then flip-flop 2 provides non-overlapping signals at simple frequency as does flip-flop 1. This arrangement provides two couples of non overlapping single frequency signals with a determined phase relationship between each of the couples.

We claim:

1. A circuit for generating non-overlapping complementary clock signals at a double frequency from an input clock signal, comprising:
    an NAND flip-flop with NAND gates and complementary outputs on which said double frequency signals are available,
    a D-type flip-flop having a data input, a clock input and an output receiving at its clock input one of the outputs of the NAND flip-flop, and the output of which is coupled to its data input through an invertor (I2), and
    two Exclusive OR gates receiving on their first inputs the input clock signal and its complement, respectively, and on their second inputs the output of the D-type flip-flop, the outputs of said OR gates being connected to the inputs of said NAND flip-flop, respectively.

2. A circuit for generating non-overlapping complementary clock signals at a double frequency from an input clock signal, said double frequency clock signals having a determined phase relationship with respect to non-overlapping complementary clock signals at the input frequency, comprising:
    a circuit for generating non-overlapping complementary clock signals at a double frequency including
    (a) an NAND flip-flop with NAND gates and complementary outputs on which said double frequency signals are available,
    (b) a D-type flip-flop having a data input, a clock input and an output receiving at its clock input one of the outputs of the NAND flip-flop, and the output of which is coupled to its data input through an invertor, and
    (c) two Exclusive OR gates receiving on their first inputs the input clock signal and its complement, respectively, and on their second inputs the output of the D-type flip-flop, the outputs of said OR gates being connected to the inputs of said NAND flip-flop, respectively;
    a conventional NAND flip-flop circuit for generating non-overlapping complementary clock signals; and
    enabling means of one input of each NAND flip-flop for enabling said one input when one of the outputs of the other NAND flip-flop is switched.

3. A circuit according to claim 1, wherein the NAND flip-flops are such that switching from high level to low level have not the same delay as switching from low level to high level.

4. A circuit for doubling the frequency of an input signal to produce first and second non-overlapping complementary clock signals at a double frequency, comprising:
   first bistable delay means for receiving a signal having first and second states and generating said first and second signals in response to a change of state of said received signal, wherein said second signal having the first and second states is delayed with respect to said first signal, and said first signal is delayed with respect to a time of said change of state;
   second bistable delay means connected to the output of said first bistable delay means for generating a delayed signal in response to transition of said second signal from the first state to the second; and
   edge-triggering means responsive to said delayed signal and said input signal to cause said change of state of said received signal.

5. A circuit according to claim 4, wherein said change of state of said received signal from the first state to the second causes a delay different from that caused by said change of state from the second state to the first.

6. A circuit according to claim 4, wherein said first bistable delay means comprises an NAND flip-flop having complementary outputs on which said first and second signals are generated.

7. A circuit according to claim 4, wherein said second bistable delay means comprises a D-type flip-flop having an input responsive to the output of said first bistable delay means and an output for delaying the signal received at said input.

8. A circuit according to claim 4, wherein said edge-triggering means comprises two Exclusive OR gates receiving on their first inputs said input signal and its complement and on their second inputs the output of said second bistable delay means to cause said change of state of the signal received by said first bistable delay means.

* * * * *